(12) United States Patent
Khandelwal et al.

(10) Patent No.: US 7,521,379 B2
(45) Date of Patent: Apr. 21, 2009

(54) DEPOSITION AND DENSIFICATION PROCESS FOR TITANIUM NITRIDE BARRIER LAYERS

(75) Inventors: Amit Khandelwal, Santa Clara, CA (US); Avgerinos V. Gelatos, Redwood City, CA (US); Christophe Marcadal, Santa Clara, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 11/869,557

(22) Filed: Oct. 9, 2007

(65) Prior Publication Data

US 2008/0085611 A1 Apr. 10, 2008

Related U.S. Application Data

(60) Provisional application No. 60/828,739, filed on Oct. 9, 2006.

(51) Int. Cl.
*H01L 21/44* (2006.01)
*H01L 21/469* (2006.01)

(52) U.S. Cl. .................... 438/785; 438/685; 438/758; 438/778

(58) Field of Classification Search .................. 438/785
See application file for complete search history.

(56) References Cited

U.S. PATENT DOCUMENTS

| 4,486,487 A | 12/1984 | Skarp et al. |
| 5,306,666 A | 4/1994 | Izumi et al. |

(Continued)

FOREIGN PATENT DOCUMENTS

| EP | 1167569 | 1/2002 |

(Continued)

OTHER PUBLICATIONS

Cameron, et al. "Atomic Layer Deposition of $SiO_2$ and $TiO_2$ in Alumina Tubular Membranes," Langmuir, vol. 16, No. 19, American Chemical Society, 2000, pp. 7435-7444.

(Continued)

*Primary Examiner*—Tung S Lau
*Assistant Examiner*—Lawrence Tynes, Jr.
(74) *Attorney, Agent, or Firm*—Patterson & Sheridan, LLP (57) ABSTRACT

In one embodiment, a method for forming a titanium nitride barrier material on a substrate is provided which includes depositing a titanium nitride layer on the substrate by a metal-organic chemical vapor deposition (MOCVD) process, and thereafter, densifying the titanium nitride layer by exposing the substrate to a plasma process. In one example, the MOCVD process and the densifying plasma process is repeated to form a barrier stack by depositing a second titanium nitride layer on the first titanium nitride layer. In another example, a third titanium nitride layer is deposited on the second titanium nitride layer. Subsequently, the method provides depositing a conductive material on the substrate and exposing the substrate to a annealing process. In one example, each titanium nitride layer may have a thickness of about 15 Å and the titanium nitride barrier stack may have a copper diffusion potential of less than about $5 \times 10^{10}$ atoms/cm$^2$.

9 Claims, 4 Drawing Sheets

U.S. PATENT DOCUMENTS

| | | |
|---|---|---|
| 5,374,570 A | 12/1994 | Nasu et al. |
| 5,526,244 A | 6/1996 | Bishop |
| 5,711,811 A | 1/1998 | Suntola et al. |
| 5,834,372 A | 11/1998 | Lee et al. |
| 5,916,365 A | 6/1999 | Sherman |
| 5,989,345 A | 11/1999 | Hatano et al. |
| 6,001,420 A | 12/1999 | Mosely et al. |
| 6,015,590 A | 1/2000 | Suntola et al. |
| 6,139,700 A | 10/2000 | Kang et al. |
| 6,174,809 B1 | 1/2001 | Kang et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,270,572 B1 | 8/2001 | Kim et al. |
| 6,284,646 B1 | 9/2001 | Leem et al. |
| 6,287,965 B1 | 9/2001 | Kang et al. |
| 6,291,342 B2 * | 9/2001 | Lee et al. .................. 438/648 |
| 6,294,836 B1 | 9/2001 | Paranjpe et al. |
| 6,305,314 B1 | 10/2001 | Sneh et al. |
| 6,342,277 B1 | 1/2002 | Sherman |
| 6,348,376 B2 | 2/2002 | Lim et al. |
| 6,358,829 B2 | 3/2002 | Yoon et al. |
| 6,365,502 B1 | 4/2002 | Paranjpe et al. |
| 6,372,598 B2 | 4/2002 | Kang et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,482,733 B2 | 11/2002 | Raaijmakers et al. |
| 6,498,091 B1 | 12/2002 | Chen et al. |
| 6,511,539 B1 | 1/2003 | Raaijmakers et al. |
| 6,524,952 B1 | 2/2003 | Srinivas et al. |
| 6,534,395 B2 | 3/2003 | Werkhoven et al. |
| 6,548,424 B2 | 4/2003 | Putkonen et al. |
| 6,551,929 B1 | 4/2003 | Kori et al. |
| 6,569,501 B2 | 5/2003 | Chiang et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,627,995 B2 | 9/2003 | Paranjpe et al. |
| 6,630,201 B2 | 10/2003 | Chiang et al. |
| 6,632,279 B1 | 10/2003 | Ritala et al. |
| 6,645,847 B2 | 11/2003 | Paranjpe et al. |
| 6,660,622 B2 | 12/2003 | Chen et al. |
| 6,686,271 B2 | 2/2004 | Raaijmakers et al. |
| 6,720,027 B2 | 4/2004 | Yang et al. |
| 6,740,585 B2 | 5/2004 | Yoon et al. |
| 6,777,352 B2 | 8/2004 | Tepman et al. |
| 6,790,773 B1 | 9/2004 | Drewery et al. |
| 6,803,272 B1 | 10/2004 | Halliyal et al. |
| 6,812,126 B1 | 11/2004 | Paranjpe et al. |
| 6,815,285 B2 | 11/2004 | Choi et al. |
| 6,821,563 B2 | 11/2004 | Yudovsky |
| 6,831,004 B2 | 12/2004 | Byun et al. |
| 6,838,125 B2 | 1/2005 | Chung et al. |
| 6,846,516 B2 | 1/2005 | Yang et al. |
| 6,849,545 B2 | 2/2005 | Mak et al. |
| 6,861,356 B2 | 3/2005 | Matsuse et al. |
| 6,875,271 B2 | 4/2005 | Glenn et al. |
| 6,893,915 B2 | 5/2005 | Park et al. |
| 6,911,391 B2 | 6/2005 | Yang et al. |
| 6,953,742 B2 | 10/2005 | Chen et al. |
| 6,958,296 B2 | 10/2005 | Chen et al. |
| 6,998,014 B2 | 2/2006 | Chen et al. |
| 7,026,238 B2 | 4/2006 | Xi et al. |
| 7,041,335 B2 | 5/2006 | Chung |
| 7,049,226 B2 | 5/2006 | Chung et al. |
| 7,081,271 B2 | 7/2006 | Chung et al. |
| 7,094,685 B2 | 8/2006 | Yang et al. |
| 7,208,413 B2 | 4/2007 | Byun et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0024387 A1 | 9/2001 | Raaijmakers et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |
| 2002/0000598 A1 | 1/2002 | Kang et al. |
| 2002/0007790 A1 | 1/2002 | Park |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0048635 A1 | 4/2002 | Kim et al. |
| 2002/0052097 A1 | 5/2002 | Park |
| 2002/0060363 A1 | 5/2002 | Xi et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0094689 A1 | 7/2002 | Park |
| 2002/0104481 A1 | 8/2002 | Chiang et al. |
| 2002/0106536 A1 | 8/2002 | Lee et al. |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197856 A1 | 12/2002 | Matsuse et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0022487 A1 | 1/2003 | Yoon et al. |
| 2003/0022507 A1 | 1/2003 | Chen et al. |
| 2003/0029715 A1 | 2/2003 | Yu et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0054631 A1 | 3/2003 | Raaijmakers et al. |
| 2003/0072884 A1 | 4/2003 | Zhang et al. |
| 2003/0072975 A1 | 4/2003 | Shero et al. |
| 2003/0082296 A1 | 5/2003 | Elers et al. |
| 2003/0082300 A1 | 5/2003 | Todd et al. |
| 2003/0082301 A1 | 5/2003 | Chen et al. |

| | | |
|---|---|---|
| 2003/0082307 A1 | 5/2003 | Chung et al. |
| 2003/0087520 A1 | 5/2003 | Chen et al. |
| 2003/0089308 A1 | 5/2003 | Raaijmakers |
| 2003/0101927 A1 | 6/2003 | Raaijmakers |
| 2003/0108674 A1 | 6/2003 | Chung et al. |
| 2003/0116087 A1 | 6/2003 | Nguyen et al. |
| 2003/0124262 A1 | 7/2003 | Chen et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153177 A1 | 8/2003 | Tepman et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0205729 A1 | 11/2003 | Basceri et al. |
| 2003/0219942 A1 | 11/2003 | Choi et al. |
| 2003/0232497 A1 | 12/2003 | Xi et al. |
| 2004/0005749 A1 | 1/2004 | Choi et al. |
| 2004/0009307 A1 | 1/2004 | Koh et al. |
| 2004/0009336 A1 | 1/2004 | Marcadal et al. |
| 2004/0013803 A1 | 1/2004 | Chung et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0033698 A1 | 2/2004 | Lee et al. |
| 2004/0043630 A1 | 3/2004 | Vaartstra et al. |
| 2004/0065255 A1 | 4/2004 | Yang et al. |
| 2004/0067641 A1 | 4/2004 | Yudovsky |
| 2004/0077183 A1 | 4/2004 | Chung |
| 2004/0105934 A1 | 6/2004 | Chang et al. |
| 2004/0197492 A1 | 10/2004 | Chen et al. |
| 2004/0209460 A1 | 10/2004 | Xi et al. |
| 2004/0211665 A1 | 10/2004 | Yoon et al. |
| 2004/0214354 A1 | 10/2004 | Marsh et al. |
| 2004/0235285 A1 | 11/2004 | Kang et al. |
| 2004/0241321 A1 | 12/2004 | Ganguli et al. |
| 2005/0006799 A1 | 1/2005 | Gregg et al. |
| 2005/0008779 A1 | 1/2005 | Yang et al. |
| 2005/0074968 A1 | 4/2005 | Chen et al. |
| 2005/0106865 A1 | 5/2005 | Chung et al. |
| 2005/0118804 A1 | 6/2005 | Byun et al. |
| 2005/0220998 A1 | 10/2005 | Chang et al. |
| 2005/0252449 A1 | 11/2005 | Nguyen et al. |
| 2005/0255690 A1 | 11/2005 | Chen et al. |
| 2005/0260357 A1 | 11/2005 | Olsen et al. |
| 2005/0271812 A1 | 12/2005 | Myo et al. |
| 2005/0271813 A1 | 12/2005 | Kher et al. |
| 2005/0277290 A1 | 12/2005 | Yang et al. |
| 2006/0019033 A1 | 1/2006 | Muthukrishnan et al. |
| 2006/0062917 A1 | 3/2006 | Muthukrishnan et al. |
| 2006/0075966 A1 | 4/2006 | Chen et al. |
| 2006/0148253 A1 | 7/2006 | Chung et al. |
| 2006/0153973 A1 | 7/2006 | Chang et al. |
| 2006/0153995 A1 | 7/2006 | Narwankar et al. |
| 2006/0156979 A1 | 7/2006 | Thakur et al. |
| 2006/0199372 A1 | 9/2006 | Chung et al. |
| 2006/0216928 A1 | 9/2006 | Chung et al. |
| 2006/0276020 A1 | 12/2006 | Yoon et al. |
| 2006/0292864 A1 | 12/2006 | Yang et al. |
| 2007/0003698 A1 | 1/2007 | Chen et al. |
| 2007/0020890 A1 | 1/2007 | Thakur et al. |
| 2007/0026147 A1 | 2/2007 | Chen et al. |
| 2007/0099415 A1 | 5/2007 | Chen et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |

FOREIGN PATENT DOCUMENTS

| | | |
|---|---|---|
| GB | 2355727 | 5/2001 |
| JP | 02246161 | 10/1990 |
| JP | 07300649 | 11/1995 |
| JP | 10308283 | 11/1998 |
| JP | 2000031387 | 1/2000 |
| JP | 2000058777 | 2/2000 |
| JP | 2001111000 | 4/2001 |
| JP | 2001172767 | 6/2001 |
| JP | 2001220294 | 8/2001 |
| JP | 2001254181 | 9/2001 |
| WO | WO-9617107 | 6/1996 |
| WO | WO-9901595 | 1/1999 |
| WO | WO-9929924 | 6/1999 |
| WO | WO-0015865 | 3/2000 |
| WO | WO-0016377 | 3/2000 |
| WO | WO-0054320 | 9/2000 |
| WO | WO-0063957 | 10/2000 |
| WO | WO-0079576 | 12/2000 |
| WO | WO-0115220 | 3/2001 |
| WO | WO-0117692 | 3/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0166832 | 9/2001 |
| WO | WO-0201628 | 1/2002 |
| WO | WO-0245871 | 6/2002 |
| WO | WO-0246489 | 6/2002 |
| WO | WO-0267319 | 8/2002 |

OTHER PUBLICATIONS

George, et al. "Surface Chemistry for Atomic Layer Growth," J. Phys. Chem. 1996, 100, pp. 13121-13131.

Goswami, et al. Transition Metals Show Promise as Copper Barriers, Semiconductor International, ATMI, San Jose—May 1, 2004.

Hwang, et al. "Nanometer-Size α-$PbO_2$-type $TiO_2$ in Garnet: A Thermobarometer for Ultrahigh-Pressure Metamorphism," Science, vol. 288, (Apr. 14, 2000).

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999), pp. 435-448.

Martensson, et al. "Use of Atomic Layer Epitaxy for Fabrication of Si/TiN/Cu Structures," J. Vac. Sci. & Tech. B, vol. 17, No. 5, (Sep. 1999), pp. 2122-2128.

Min, et al. "Atomic Layer Deposition of TiN Thin Films by Sequential Introduction of Ti Precursor and $NH_3$," Mat. Res. Soc. Symp. Proc., vol. 514 (1998).

Min, et al. "Chemical Vapor Deposition of Ti-Si-N Films With Alternating Source Supply," Mat. Rec. Soc. Symp. Proc. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996), pp. 23-29.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug. 1998), pp. 2914-2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

* cited by examiner

DEPOSITION AND DENSIFICATION PROCESS FOR TITANIUM NITRIDE BARRIER LAYERS

CROSS-REFERENCE TO RELATED APPLICATION

This application claims benefit of U.S. Ser. No. 60/828,739 (APPM/011097L), filed Oct. 9, 2006, which is herein incorporated by reference in its entirety.

BACKGROUND OF THE INVENTION

1. Field of the Invention

Embodiments of the invention generally relate to a fabrication process for depositing a barrier layer on a substrate, and more particularly to a deposition and densification process for forming a titanium nitride barrier material.

2. Description of the Related Art

Reliably producing submicron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between, decrease to 45 nm and 32 nm dimensions, whereas the thickness of the dielectric layers remain substantially constant, with the result of increasing the aspect ratios of the features. Many traditional deposition processes have difficulty filling submicron structures where the aspect ratio exceeds 4:1. Therefore, there is a great amount of ongoing effort being directed at the formation of substantially void-free and seam-free submicron features having high aspect ratios.

In the manufacture of integrated circuits, a titanium/titanium nitride stack, a titanium nitride layer over a titanium layer, is often used as a liner barrier. The titanium/titanium nitride stack may be used to provide contacts to the source and drain of a transistor. In one example, a titanium layer may be deposited over a silicon substrate. The titanium nitride layer may be deposited over the titanium layer. The titanium nitride layer may be used as a barrier layer to inhibit the diffusion of metals into regions underlying the barrier layer. A conductive metal layer, such as a copper-containing layer or a tungsten-containing layer, is usually deposited over the titanium nitride layer.

The titanium layer or the titanium nitride layer may be formed by a chemical vapor deposition (CVD) process, an atomic layer deposition (ALD) process, and/or a physical vapor deposition (PVD) process. For example, the titanium layer may be formed by reacting titanium tetrachloride with a reducing agent during a CVD process and the titanium nitride layer may be formed by reacting titanium tetrachloride with ammonia during a CVD process. Thereafter, the conductive material may be deposited onto the substrate.

A variety of problems that eventually may lead to device failure is a result from the specific process used to deposit or form the titanium nitride layer. Reliability problems may occur from the use of titanium tetrachloride as a chemical precursor to form a titanium nitride layer during a CVD process. In particular, the titanium nitride layer may have poor adhesion over the titanium layer, resulting in peeling of the titanium nitride layer from the titanium layer. Another problem arises since the titanium tetrachloride precursor produces chlorine which diffuses and contaminates neighboring materials (e.g., dielectric or conductive) on the substrate.

Titanium nitride barrier layers deposited with a traditional CVD process further endure the severe problem of the conductive contact material (e.g., Cu, W, or Al) diffusing through the barrier layer and into neighboring materials, such as dielectric materials. Often, this diffusion problem occurs because the barrier layer is too thin or contains a barrier material not dense enough (e.g., too porous) to prohibit or limit the diffusing metallic atoms. Thicker barrier layers may be used to limit or control diffusion. However, the resistance of a barrier layer increases proportional to the thickness, as does the time and cost for deposition.

Therefore, there is a need for an improved method of depositing and densifying barrier materials, particularly titanium nitride barrier layers.

SUMMARY OF THE INVENTION

In one embodiment, a method for forming a titanium nitride barrier material on a substrate is provided which includes depositing a first titanium nitride layer on the substrate by a thermal metal-organic chemical vapor deposition (MOCVD) process, and thereafter, densifying the first titanium nitride layer by exposing the substrate to a plasma process. In one example, the method provides forming a titanium nitride barrier stack by depositing a second titanium nitride layer on the first titanium nitride layer by the thermal MOCVD process and densifying the second titanium nitride layer by exposing the substrate to the plasma process. In another example, the method provides forming a titanium nitride barrier stack by depositing a third titanium nitride layer on the second titanium nitride layer by the thermal MOCVD process and densifying the third titanium nitride layer by exposing the substrate to the plasma process. Therefore, the titanium nitride barrier material may contain a single densified titanium nitride layer or a titanium nitride barrier stack containing two, three, or more densified titanium nitride layers. Subsequently, the method provides depositing a conductive material on the substrate and exposing the substrate to a thermal annealing process.

In another embodiment, a method for forming a titanium nitride barrier stack on a substrate is provided which includes exposing the substrate sequentially to a titanium nitride deposition gas and to a densifying plasma to form a plurality of densified titanium nitride barrier layers during a deposition-densification cycle. Generally, each of the densified titanium nitride barrier layers may have a thickness of about 20 Å or less. Subsequently, the method provides depositing a conductive material on the substrate and exposing the substrate to a thermal annealing process. The deposition-densification cycle may be repeated to form a titanium nitride barrier stack having the predetermined thickness.

In some examples, the substrate may be exposed to hydrogen and at least nitrogen, argon, helium, neon, or combinations thereof during the plasma process. The plasma process may occur for a time period within a range from about 10 seconds to about 20 seconds while the plasma generator may have a power setting within a range from about 750 watts to about 1,250 watts. For example, the substrate may be exposed to a plasma for about 15 seconds while having a plasma power set at about 1,000 watts during the plasma process.

In one embodiment, the first titanium nitride layer, the second titanium nitride layer, or the third titanium nitride layer may independently have a thickness of about 50 Å or less, preferably, about 25 Å or less, and more preferably, about 15 Å or less. In one example, the titanium nitride layer may have a thickness within a range from about 5 Å to about 20 Å, for example, about 15 Å or less. In another embodiment, the titanium nitride barrier stack may have a copper diffusion potential of less than about $5 \times 10^{10}$ atoms/cm$^2$, preferably, less than about $4 \times 10^{10}$ atoms/cm$^2$, more preferably, less than about $2.5 \times 10^{10}$ atoms/cm$^2$, and more preferably, less than about $1 \times 10^{10}$ atoms/cm$^2$. Alternatively, the titanium nitride barrier material may have a copper diffusion potential of less than about $1 \times 10^7$ atoms/cm$^3$.

In other embodiments, the titanium nitride barrier stack may be deposited on a metallic titanium layer disposed on the substrate. In one example, the metallic titanium layer may be deposited on the substrate by a physical vapor deposition (PVD) process. In another example, the metallic titanium layer may be deposited on the substrate by an atomic layer deposition (ALD) process. In another example, the metallic titanium layer may be deposited on the substrate by a CVD process. The conductive material, which is deposited on the substrate after forming the titanium nitride barrier stack, may contain copper, tungsten, aluminum, titanium, tantalum, ruthenium, cobalt, alloys thereof, or combinations thereof. In one example, the conductive material contains tungsten or a tungsten alloy. In another example, the conductive material contains copper or a copper alloy. In another example, the conductive material contains aluminum or an aluminum alloy. Thereafter, the substrate may be exposed to a thermal annealing process. The thermal annealing process may occur for a time period within a range from about 30 minutes to about 90 minutes while the substrate is heated to a temperature within a range from about 350° C. to about 500° C. For example, the substrate may be heated at about 425° C. for about 60 minutes during the thermal annealing process.

In another embodiment, the substrate may be exposed to a deposition gas containing a metal-organic titanium precursor and a nitrogen precursor during the thermal MOCVD process. The titanium precursor may be a metal-organic compound, such as a tetrakis(dialkylamido) titanium compound which includes tetrakis(dimethylamido) titanium (TDMAT), tetrakis(diethylamido) titanium (TDEAT), tetrakis(ethylmethylamido) titanium (TEMAT), or derivatives thereof. Although nitrogen is usually derived during decomposition of the amido ligands from a tetrakis(dialkylamido) titanium compound, in an alternative embodiment, a nitrogen precursor gas may be co-flowed with the titanium precursor. The nitrogen precursor gas may contain ammonia, hydrazine, methylhydrazine, dimethylhydrazine, tertbutylhydrazine, phenylhydrazine, 2,2'-azotertbutane, ethylazide, nitrogen, plasmas thereof, derivatives thereof, or combinations thereof. During the MOCVD process, the substrate may be heated to a temperature within a range from about 250° C. to about 500° C.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

One embodiment of the invention provides a method of forming a densified titanium nitride layer on a substrate by depositing a titanium nitride layer on the substrate and densifying the titanium nitride layer by exposing the substrate to a hydrogen-containing plasma. In another embodiment, a method for forming a titanium nitride barrier stack on a substrate is provided which includes exposing the substrate sequentially to a titanium nitride deposition gas and a densifying plasma to form a plurality of densified titanium nitride layers, such that each densified titanium nitride layer is formed during a deposition-densification cycle. Each titanium nitride layer may be deposited and plasma-treated incrementally without an intervening step prior to depositing a conductive material layer on the substrate. Generally, each of the densified titanium nitride layers may have a thickness of about 20 Å or less. In one example, each densified titanium nitride layer may have a thickness within a range from about 5 Å to about 20 Å, for example, about 15 Å or less.

Subsequently, the method provides depositing a conductive material on the substrate and exposing the substrate to a thermal annealing process. The deposition-densification cycle may be repeated to form a titanium nitride barrier stack having a predetermined thickness, such as about 100 Å or less, preferably, within a range from about 10 Å to about 80 Å, more preferably, from about 30 Å to about 50 Å. In one example, the deposition-densification cycle is repeated two times to form a titanium nitride barrier stack having a thickness of about 30 Å. In another example, the deposition-densification cycle is repeated three times to form a titanium nitride barrier stack having a thickness of about 50 Å. In another example, the deposition-densification cycle is repeated four times to form a titanium nitride barrier stack having a thickness of about 60 Å.

In other embodiments, the titanium nitride layer may be deposited by a MOCVD process. The MOCVD process may contain the steps of vaporizing a organic titanium precursor, introducing the vaporized titanium precursor into a CVD chamber, maintaining the deposition chamber at a pressure and the substrate at a temperature suitable for the high pressure CVD of the titanium nitride film onto the substrate, and thermally decomposing the titanium precursor while depositing the titanium nitride material onto the substrate surface. The titanium precursor may be a metal-organic compound that includes tetrakis(dialkylamido) titanium compounds, such as tetrakis(dimethylamido) titanium (TDMAT), tetrakis(diethylamido) titanium (TDEAT), tetrakis(ethylmethylamido) titanium (TEMAT), and derivatives thereof. Generally, tetrakis(dialkylamido) titanium compounds are thermally decomposed and the nitrogen of the amido ligands is incorporated as nitrogen within the titanium nitride material during a thermal CVD process. However, in an alternative embodiment, a nitrogen precursor may be used during a CVD process to deposit the titanium nitride barrier layers. The nitrogen concentration of the titanium nitride barrier layers may be increased by adding a supplemental nitrogen precursor.

The nitrogen precursor for forming or depositing titanium nitride or other nitrogen-containing materials includes ammonia ($NH_3$), nitrogen ($N_2$), hydrazine ($N_2H_4$), methyl hydrazine ($CH_3N_2H_3$), dimethyl hydrazine ($(CH_3)_2N_2H_2$), tertbutylhydrazine ($C_4H_9N_2H_3$), phenylhydrazine ($C_6H_5N_2H_3$), 2,2'-azotertbutane ($(CH_3)_6C_2N_2$), ethylazide ($C_2H_5N_3$), plasmas thereof, derivatives thereof, or combinations thereof. The deposited titanium nitride layer may have a thickness of about 100 Å or less, preferably, about 50 Å or less, more preferably, about 25 Å or less, and more preferably, about 15 Å or less. In one example, the titanium nitride layer may have a thickness within a range from about 5 Å to about 20 Å, for example, about 15 Å or less.

Generally, the deposition chamber during the deposition process has an internal pressure of less than 760 Torr, preferably, less than about 100 Torr, such as within a range from about 1 Torr to about 10 Torr, for example, about 5 Torr. The substrate may be heated to a temperature within a range from about 250° C. to about 500° C., preferably, from about 320° C. to about 420° C., for example, about 360° C. The substrate may be exposed to a deposition gas containing the titanium precursor and at least one carrier gas, such as nitrogen, helium, argon, hydrogen, or combinations thereof. In one embodiment, the substrate may be exposed to a deposition gas containing a tetrakis(dialkylamido) titanium compound having a flow rate within a range from about 10 sccm to about 150 sccm, preferably, from about 20 sccm to about 100 sccm, and more preferably, from about 40 sccm to about 70 sccm, for example, about 55 sccm. The deposition gas may further contain at least one carrier gas having a flow rate within a range from about 1,000 sccm to about 5,000 sccm, preferably, from about 2,000 sccm to about 4,000 sccm, for example, about 3,000 sccm. In one example, the substrate is exposed to a deposition gas containing TDMAT with a flow rate of about 55 sccm, nitrogen gas with a flow rate of about 2,500 sccm, and helium with a flow rate of about 600 sccm during a MOCVD process. In another example, the substrate is exposed to a deposition gas containing TDEAT with a flow rate of about 60 sccm and nitrogen gas with a flow rate of about 3,000 sccm during a MOCVD process.

The titanium nitride layer may be exposed to the plasma formed by a plasma generator set at a power within a range from about 500 watts to about 1,250 watts, preferably, from about 750 watts to about 1,150 watts, and more preferably, from about 900 watts to about 1,100 watts, for example, about 1,000 watts. In one example, a 300 mm diameter substrate may be exposed to the plasma with the plasma generator has a power setting within a range from about 750 watts to about 1,250 watts, preferably, from about 850 watts to about 1,150 watts, and more preferably, from about 900 watts to about 1,100 watts, for example, about 1,000 watts. In another example, a 200 mm diameter substrate may be exposed to the plasma with the plasma generator has a power setting within a range from about 500 watts to about 1,000 watts, preferably, from about 600 watts to about 800 watts, and more preferably, from about 650 watts to about 750 watts, for example, about 700 watts. The substrate may be exposed to a plasma during the plasma process for a time period within a range from about 5 seconds to about 30 seconds, preferably, from about 10 seconds to about 20 seconds, and more preferably, from about 12 seconds to about 18 seconds, for example, about 15 seconds.

Generally, the substrate may be exposed to hydrogen and at least nitrogen, argon, helium, neon, or combinations thereof during the plasma process. In one embodiment, the substrate may be exposed to a plasma gas containing hydrogen gas having a flow rate within a range from about 500 sccm to about 3,000 sccm, preferably, from about 1,000 sccm to about 2,500 sccm, and more preferably, from about 1,500 sccm to about 2,000 sccm, for example, about 1,800 sccm. The plasma gas may further contain at least one carrier gas having a flow rate within a range from about 500 sccm to about 2,500 sccm, preferably, from about 800 sccm to about 2,000 sccm, more preferably, from about 1,000 sccm to about 1,500 sccm, for example, about 1,200 sccm. In one example, the substrate is exposed to a plasma gas containing hydrogen gas with a flow rate of about 1,800 sccm and nitrogen gas with a flow rate of about 1,200 sccm during a densifying plasma process. Therefore, the plasma process may occur for a time period within a range from about 10 seconds to about 20 seconds and the plasma generator has a power setting within a range from about 750 watts to about 1,250 watts. For example, the plasma process may last about 15 seconds with the plasma generator having a plasma power of about 1,000 watts.

Embodiments provide that the densified titanium nitride layer is denser than the deposited titanium nitride layer, such as at least about 10% denser, preferably, at least about 20% denser, and more preferably, at least about 25% denser than the initially deposited titanium nitride layer. Also, the densified titanium nitride layer is usually more electrically conductive than the deposited titanium nitride layer due to the lower concentrations of carbon and oxygen than the initially deposited titanium nitride layer. For example, the densified titanium nitride layer may have a conductance within a range from about 5% to about 10% higher than the initially deposited titanium nitride layer.

Figure 1:
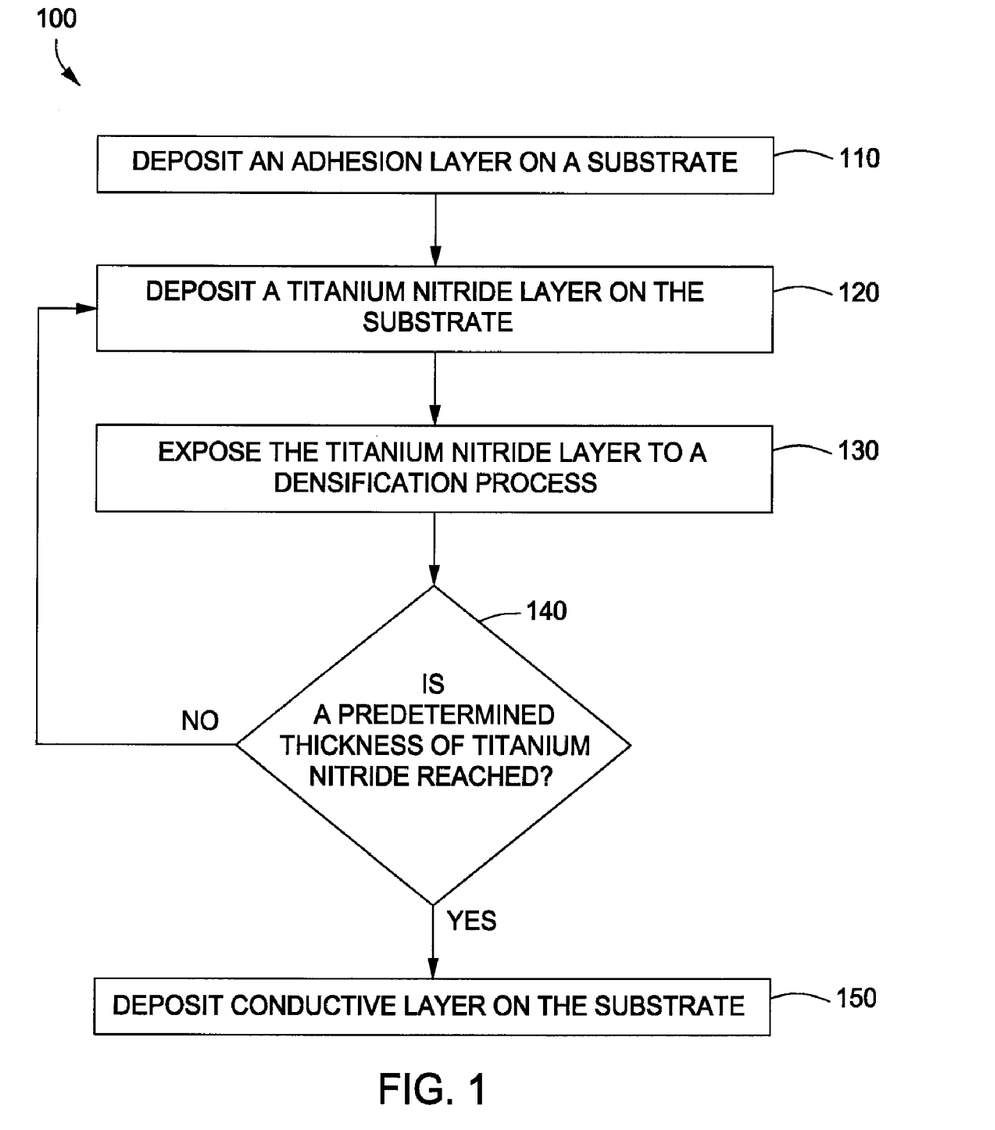
FIG. 1 shows a flow chart of a process for depositing and densifying a titanium nitride material as described in one embodiment herein.

FIG. 1 illustrates a flow chart of process 100 for depositing and densifying a titanium nitride material, such as a titanium nitride barrier layer or a titanium nitride barrier stack as described in embodiments herein. FIGS. 2A-2G depict a schematic cross-sectional view of another embodiment of an exemplary application of a titanium nitride material that may be formed on substrate 200 by utilizing process 100.

Figure 2A:
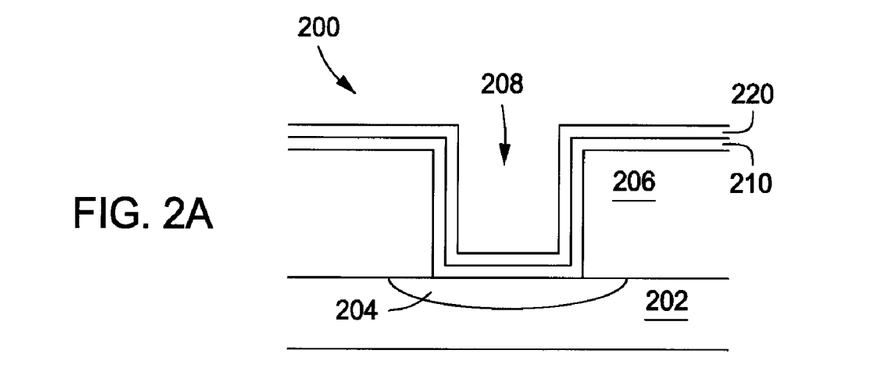
FIGS. 2A-2G depict a cross-sectional view of a substrate during processes for depositing and densifying titanium nitride layers as described in embodiments herein.

FIG. 2A depicts substrate 200 containing doped source/drain region 204 formed over lower layer 202. Lower layer 202 may be a semiconductor substrate, such as a silicon substrate or wafer, or other deposited semiconductor material. Dielectric layer 206, such as a silicon-containing layer, a silicon dioxide layer or a low-k dielectric layer, may be formed over lower layer 202. In one example, a low-k dielectric layer is an oxidized organosilane layer or an oxidized organosiloxane layer described in more detail in commonly assigned U.S. Pat. No. 6,348,725, which is incorporated by reference herein. Dielectric layer 206 may be patterned and etched to form aperture 208.

During step 110, adhesion layer 210 may be deposited on substrate 200 to provide strong adhesion between titanium nitride layer 220 that is subsequently deposited over lower layer 202, doped source/drain region 204, and/or dielectric layer 206. Adhesion layer 210 may be a metallic material deposited by vapor deposition processes, such as PVD, ALD, or CVD processes. Adhesion layer 210 may be discontinuous or continuous across the exposed surfaces of substrate 200. Adhesion layer 210 may contain titanium, tantalum, tungsten, ruthenium, cobalt, silicides thereof, alloys thereof, or combinations thereof. In one example, adhesion layer 210 is a metallic titanium layer deposited by a PVD process. In another example, adhesion layer 210 is a metallic titanium layer deposited by an ALD process.

During step 120, titanium nitride layer 220 may be deposited on substrate 200 and over aperture 208, as depicted in FIG. 2A. Titanium nitride layer 220 may completely cover adhesion layer 210 or any other exposed surface of substrate 200, such as lower layer 202, doped source/drain region 204, and/or dielectric layer 206. Titanium nitride layer 220 may be discontinuous, but preferably, is continuous across the exposed surfaces of substrate 200. In one embodiment, titanium nitride layer 220 may be deposited or formed by a CVD process, preferably, a MOCVD process, and more preferably, a thermal MOCVD process. In another embodiment, titanium nitride layer 220 may be deposited or formed by a plasma-enhanced CVD (PE-CVD) process. In an alternative embodiment, titanium nitride layer 220 may be deposited or formed by an ALD process or a PE-ALD process.

In one example of step 120, titanium nitride layer 220 may be deposited by a MOCVD process. The MOCVD process includes vaporizing a organic titanium precursor, introducing the vaporized titanium precursor into a CVD chamber, maintaining the deposition chamber at a pressure and substrate 200 at a temperature suitable for the high pressure CVD of the titanium nitride film onto substrate 200, and thermally decomposing the titanium precursor while depositing titanium nitride layer 220 onto adhesion layer 210 and substrate 200.

In one example, the titanium precursor may be a metal-organic compound, such as tetrakis(dialkylamido) titanium compounds, which include tetrakis(dimethylamido) titanium (TDMAT), tetrakis(diethylamido) titanium (TDEAT), tetrakis(ethylmethylamido) titanium (TEMAT), and derivatives thereof. Titanium nitride layer 220 may have a thickness of about 50 Å or less, preferably, about 25 Å or less, and more preferably, about 15 Å or less. In one example, titanium nitride layer 220 may have a thickness within a range from about 5 Å to about 20 Å, for example, about 15 Å or less.

Generally, the deposition chamber during the deposition process has an internal pressure of less than 760 Torr, preferably, less than about 100 Torr, such as within a range from about 1 Torr to about 10 Torr, for example, about 5 Torr. Substrate 200 may have a temperature within a range from about 250° C. to about 500° C., preferably, from about 320° C. to about 420° C., for example, about 360° C. Substrate 200 may be exposed to a deposition gas containing the titanium precursor and at least one carrier gas, such as nitrogen, helium, argon, hydrogen, or combinations thereof. In one embodiment, substrate 200 may be exposed to a tetrakis(dialkylamido) titanium compound having a flow rate within a range from about 10 sccm to about 150 sccm, preferably, from about 20 sccm to about 100 sccm, and more preferably, from about 40 sccm to about 70 sccm, for example, about 55 sccm. The deposition gas may further contain at least one carrier gas having a flow rate within a range from about 1,000 sccm to about 5,000 sccm, preferably, from about 2,000 sccm to about 4,000 sccm, for example, about 3,000 sccm. In one example, substrate 200 is exposed to a deposition gas containing TDMAT with a flow rate of about 55 sccm, nitrogen gas with a flow rate of about 2,500 sccm, and helium with a flow rate of about 600 sccm during a MOCVD process while forming titanium nitride layer 220.

Figure 2B:
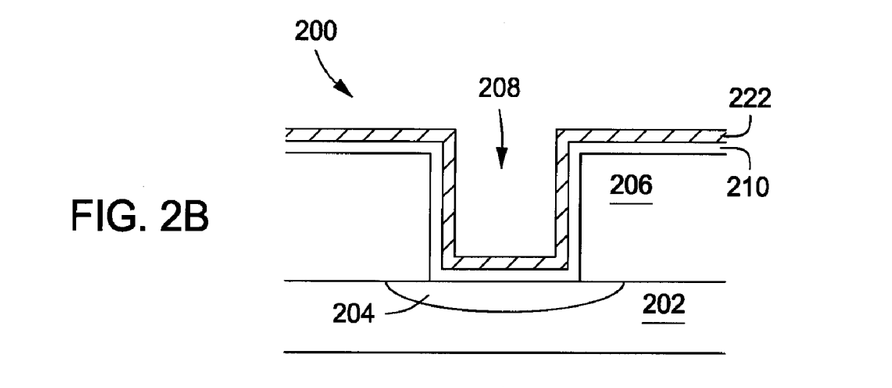

During step 130, substrate 200 may be exposed to a densifying plasma treatment process while forming densified titanium nitride layer 222 from titanium nitride layer 220, as depicted in FIG. 2B. Titanium nitride layer 220 may be exposed to the plasma having a plasma power within a range from about 750 watts to about 1,250 watts, preferably, from about 850 watts to about 1,150 watts, and more preferably, from about 900 watts to about 1,100 watts, for example, about 1,000 watts. The substrate may be exposed to a plasma during the plasma process for a time period within a range from about 5 seconds to about 30 seconds, preferably, from about 10 seconds to about 20 seconds, and more preferably, from about 12 seconds to about 18 seconds, for example, about 15 seconds. Densified titanium nitride layer 222 may be at least about 10% denser than titanium nitride layer 220, preferably, at least about 20% denser than titanium nitride layer 220.

Generally, substrate 200 may be exposed to a plasma gas containing hydrogen and at least nitrogen, argon, helium, neon, or combinations thereof during the plasma process at step 130. In one embodiment, substrate 200 may be exposed to the plasma gas containing hydrogen gas having a flow rate within a range from about 500 sccm to about 3,000 sccm, preferably, from about 1,000 sccm to about 2,500 sccm, and more preferably, from about 1,500 sccm to about 2,000 sccm, for example, about 1,800 sccm. The plasma gas may further contain at least one carrier gas having a flow rate within a range from about 500 sccm to about 2,500 sccm, preferably, from about 800 sccm to about 2,000 sccm, more preferably, from about 1,000 sccm to about 1,500 sccm, for example, about 1,200 sccm. In one example, substrate 200 is exposed to a plasma gas containing hydrogen gas with a flow rate of about 1,800 sccm and nitrogen gas with a flow rate of about 1,200 sccm during a densifying plasma process to form densified titanium nitride layer 222. The plasma process may last about 15 seconds with a plasma power of about 1,000 watts.

A predetermined thickness of titanium nitride is determined at step 140. If densified titanium nitride layer 222 has a desirable, predetermined thickness, then process 100 continues to step 150. Conductive contact layer 280 may be deposited on or over densified titanium nitride layer 222 or substrate 200 while filling in aperture 208 with a conductive metallic material during step 150 (not shown). However, if densified titanium nitride layer 222 does not have the desirable, predetermined thickness, then steps 120 and 130 may be repeated in process 100.

Figure 2C:
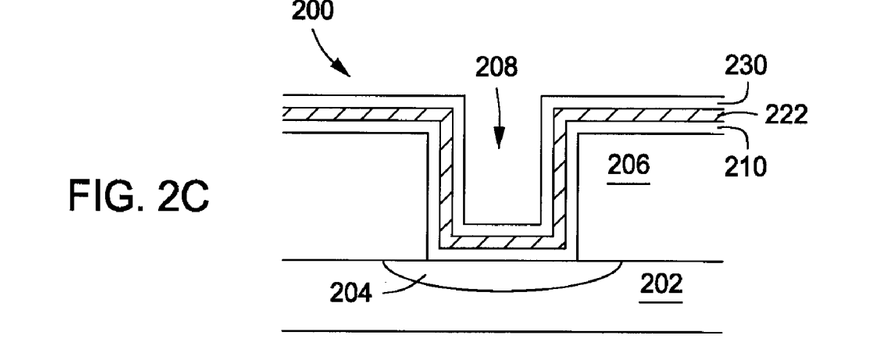

In another embodiment, step 120 may be repeated to deposit titanium nitride layer 230 on densified titanium nitride layer 222 and over aperture 208, as depicted in FIG. 2C. Titanium nitride layer 230 may have a thickness of about 50 Å or less, preferably, about 25 Å or less, and more preferably, about 15 Å or less. In one example, titanium nitride layer 230 may have a thickness within a range from about 5 Å to about 20 Å, for example, about 15 Å or less. In one example, substrate 200 is exposed to a deposition gas containing TDMAT with a flow rate of about 55 sccm, nitrogen gas with a flow rate of about 2,500 sccm, and helium with a flow rate of about 600 sccm during a MOCVD process while forming titanium nitride layer 230.

Figure 2D:
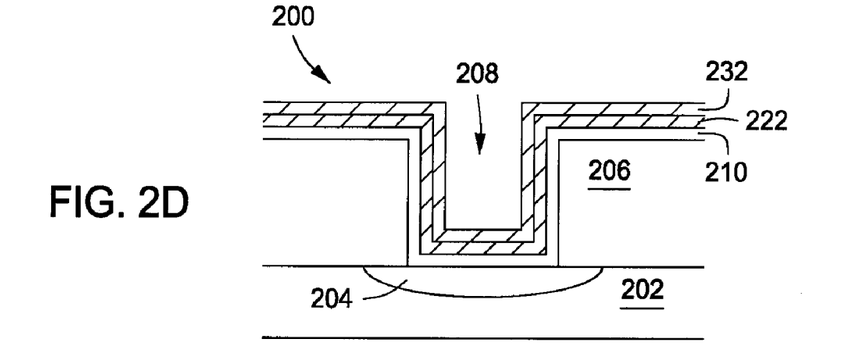

In another embodiment, step 130 is repeated by exposing substrate 200 to a densifying plasma treatment process while forming densified titanium nitride layer 232 from titanium nitride layer 230, as depicted in FIG. 2D. Titanium nitride layer 230 may be exposed to the plasma having a plasma power within a range from about 750 watts to about 1,250 watts, preferably, from about 850 watts to about 1,150 watts, and more preferably, from about 900 watts to about 1,100 watts, for example, about 1,000 watts. The plasma process may occur for a time period within a range from about 5 seconds to about 30 seconds, preferably, from about 10 seconds to about 20 seconds, and more preferably, from about 12 seconds to about 18 seconds, for example, about 15 seconds. In one example, substrate 200 is exposed to a plasma gas containing hydrogen gas with a flow rate of about 1,800 sccm and nitrogen gas with a flow rate of about 1,200 sccm during a densifying plasma process to form densified titanium nitride layer 232. The plasma process may last about 15 seconds with a plasma power of about 1,000 watts.

A predetermined thickness of titanium nitride is determined at step 140. If densified titanium nitride layer 232 has the desirable, predetermined thickness, then process 100 continues to step 150. Subsequently, conductive contact layer 280 may be deposited on or over densified titanium nitride layer 222 or substrate 200 while filling in aperture 208 with a conductive metallic material during step 150 (not shown). However, if densified titanium nitride layer 232 does not have a desirable, predetermined thickness, then the cycle is repeated by conducting steps 120 and 130.

Figure 2E:
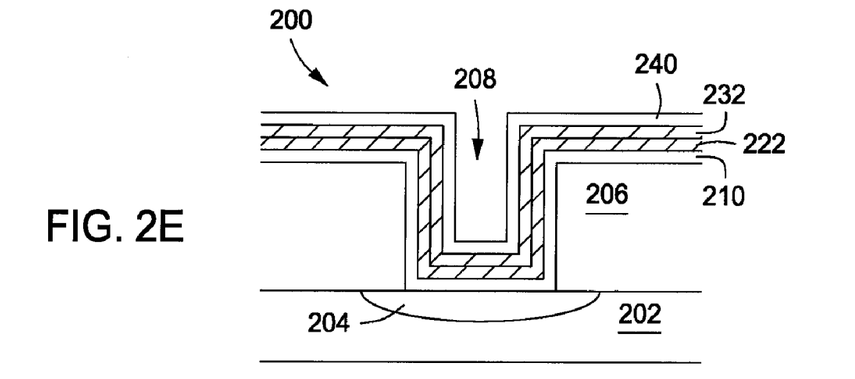

In another embodiment, step 120 may be repeated to deposit titanium nitride layer 240 on densified titanium nitride layer 232 and over aperture 208, as depicted in FIG. 2E. Titanium nitride layer 240 may have a thickness of about 50 Å or less, preferably, about 25 Å or less, and more preferably, about 15 Å or less. In one example, titanium nitride layer 240 may have a thickness within a range from about 5 Å to about 20 Å, for example, about 15 Å or less. In one example, substrate 200 is exposed to a deposition gas containing TDMAT with a flow rate of about 55 sccm, nitrogen gas with a flow rate of about 2,500 sccm, and helium with a flow rate of about 600 sccm during a MOCVD process while forming titanium nitride layer 240.

Figure 2F:
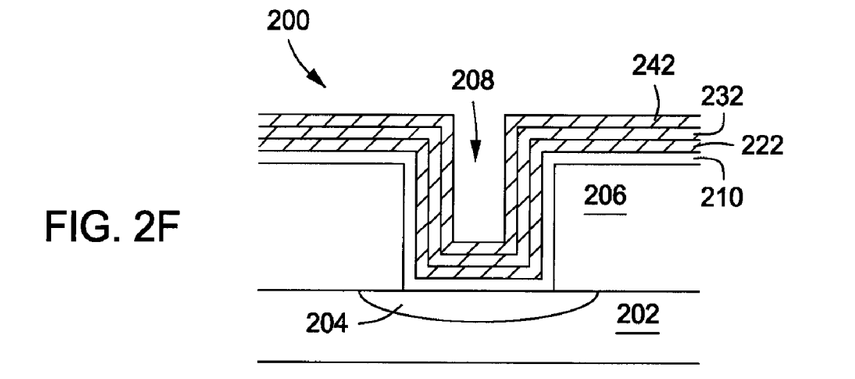

In another embodiment, step 130 may be repeated by exposing substrate 200 to a densifying plasma treatment process while forming densified titanium nitride layer 242 from titanium nitride layer 240, as depicted in FIG. 2F. Titanium nitride layer 240 may be exposed to the plasma having a plasma power within a range from about 750 watts to about 1,250 watts, preferably, from about 850 watts to about 1,150 watts, and more preferably, from about 900 watts to about 1,100 watts, for example, about 1,000 watts. The plasma process may occur for a time period within a range from about 5 seconds to about 30 seconds, preferably, from about 10 seconds to about 20 seconds, and more preferably, from about 12 seconds to about 18 seconds, for example, about 15 seconds. In one example, substrate 200 is exposed to a plasma gas containing hydrogen gas with a flow rate of about 1,800 sccm and nitrogen gas with a flow rate of about 1,200 sccm during a densifying plasma process to form densified titanium nitride layer 242. The plasma process may last about 15 seconds with a plasma power of about 1,000 watts.

A predetermined thickness of titanium nitride is determined at step 140. If densified titanium nitride layer 242 has a desirable, predetermined thickness, then process 100 continues to step 150. However, if densified titanium nitride layer 242 does not have a desirable, predetermined thickness, then steps 120 and 130 may be repeated until the titanium nitride barrier stack has a predetermined thickness.

Figure 2G:
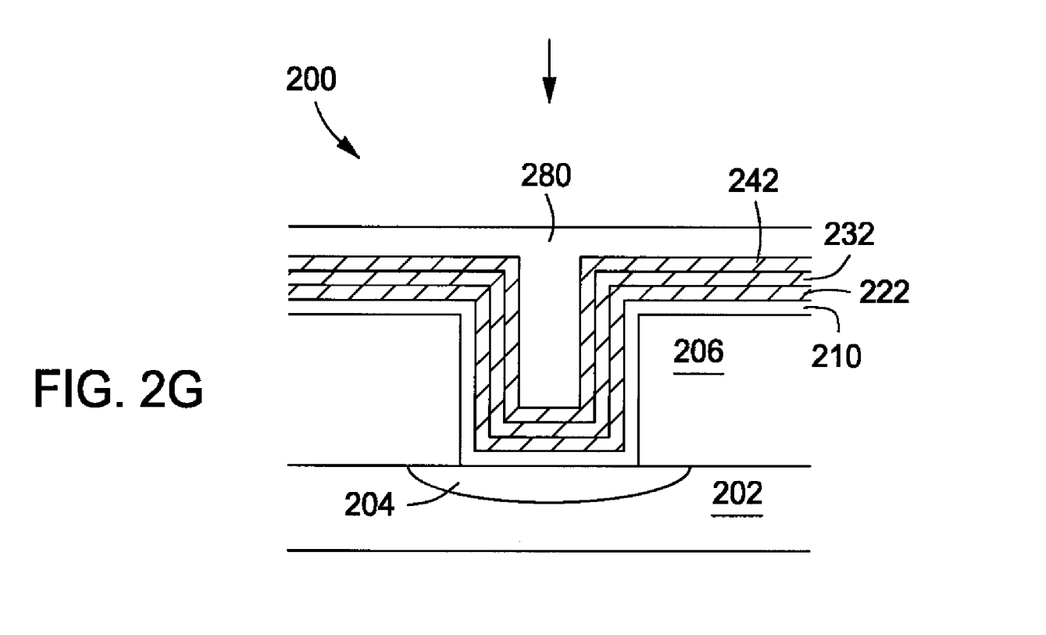

During step 150, conductive contact layer 280 may be deposited on densified titanium nitride layer 242 and substrate 200 while filling in aperture 208 with a conductive metallic material, as depicted in FIG. 2G. Conductive contact layer 280 may be a seed layer, a nucleation, a bulk layer, a fill layer, or another conductive layer that may be used in contacts. Conductive contact layer 280 may contain a conductive metallic material, such as copper, titanium, tungsten, aluminum, tantalum, ruthenium, cobalt, alloys thereof, or combinations thereof.

Conductive contact layer 280 may be deposited or formed by a PVD process, an ALD process, a CVD process, an electrochemical plating (ECP) process, or an electroless deposition process. In one example, conductive contact layer 280 contains metallic copper or a copper alloy. In another example, conductive contact layer 280 contains metallic tungsten or a tungsten alloy. In another example, the conductive material contains aluminum or an aluminum alloy.

Subsequent to step 150, substrate 200 may be exposed to a thermal annealing process in an annealing chamber or in any of the same chamber used in steps 120, 140, or 150. Substrate 200 may be heated to a temperature within a range from about 250° C. to about 700° C., preferably, from about 350° C. to about 500° C. during the thermal annealing process. The thermal annealing process may occur for a time period within a range from 15 minutes to about 120 minutes, preferably, from about 30 minutes to about 90 minutes, and more preferably, from about 45 minutes to about 75 minutes. In one example, substrate 200 may be heated at about 425° C. for about 60 minutes during a thermal annealing process.

In an alternative embodiment, substrate 200 may be transferred into a rapid thermal processing (RTP) chamber and exposed to an RTP annealing process after step 150. The CENTURA® RADIANCE® RTP chamber, available from Applied Materials, Inc., located in Santa Clara, Calif., may be used during the RTP process. The annealing chamber may be on the same cluster tool as the deposition chambers so that substrate 200 may be annealed without being exposed to the ambient environment. Substrate 200 may be heated to a temperature within a range from about 250° C. to about 700° C., preferably, from about 350° C. to about 500° C., and more preferably, from about 400° C. to about 450° C., for example, about 425° C. during the RTP annealing process. Substrate 200 may be exposed to the RTP process for a time period within a range from about 15 seconds to about 10 minutes, preferably, from about 30 seconds to about 5 minutes, and more preferably, from about 1 minute to about 4 minutes.

In another embodiment, the diffusion potential of the titanium nitride barrier stack (e.g., copper diffusion potential) may be calculated to quantitatively determine the effectiveness of the barrier layers. The diffusion potential may be used to determine a desired thickness of each densified titanium nitride layer formed during steps 120 and 130 and to determine how many densified titanium nitride layers should be deposited at step 140. In one example, the titanium nitride barrier material may have a copper diffusion potential of less than about $5 \times 10^{10}$ atoms/cm$^2$, preferably, less than about $4 \times 10^{10}$ atoms/cm$^2$, more preferably, less than about $2.5 \times 10^{10}$ atoms/cm$^2$, and more preferably, less than about $1 \times 10^{10}$ atoms/cm$^2$. Alternatively, the titanium nitride barrier material may have a copper diffusion potential of less than about $1 \times 10^7$ atoms/cm$^3$.

"Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten silicide nitride, tantalum, tantalum nitride, or tantalum silicide nitride. Substrates may have various dimensions, such as 200 mm or 300 mm diameter wafers, as well as, rectangular or square panes. Substrates include semiconductor substrates, display substrates (e.g., LCD), solar panel substrates, and other types of substrates. Unless otherwise noted, embodiments and examples described herein are preferably conducted on substrates with a 200 mm diameter or a 300 mm diameter, more preferably, a 300 mm diameter. Processes of the embodiments described herein may be used to form or deposit titanium nitride materials on many substrates and surfaces. Substrates on which embodiments of the invention may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

The following examples are given for the purpose of illustrating various embodiments of the invention and are not meant to limit the invention in any fashion.

EXAMPLES 200 mm TXZ® Chamber

A high-pressure process in a TXZ® chamber, available from Applied Materials, Inc., located in Santa Clara, Calif., is used for formation of the titanium nitride barrier layer. Low-resistivity titanium nitride thin-films are thermally deposited using a high-pressure MOCVD process. The chamber is plumbed to a titanium precursor, such as TDMAT or TDEAT. The titanium nitride thin film is subsequently plasma post treated with a hydrogen-nitrogen plasma generated by a high plasma power within a range from about 750 watts to about 1,250 watts in order to reduce the film resistivity.

Overview of the Formation of Titanium Nitride Barrier Layer

The substrate is heated to a predetermined temperature (e.g., about 360° C.). TDMAT is vaporized and exposed to the substrate to thermally decompose as a film deposited on the substrate surface at a low temperature of about 360° C. which corresponds to a heater temperature of about 380° C. and at a high chamber pressure of about 5 Torr. The process may be run with substrate temperatures ranging from about 320° C. to about 370° C. and chamber pressures ranging from about 1 Torr to about 10 Torr.

The decomposition rate of TDMAT is controlled by various process conditions. The step coverage and the deposition rates depend on the substrate temperature. As the decomposition of TDMAT is a pyrolytic process, the rate of decomposition and thereby the rate of deposition on the substrate increases with the substrate temperature. It is possible to compensate for the loss in deposition rate at a low temperature by an increase in precursor delivery. The deposition temperature is dependant on the type of application, e.g., the type of low K dielectric needed. However, a spacing change affects substrate temperature and thus the deposition rate is affected. Concomitantly, an increase in chamber pressure and/or an increase in TDMAT flow will increase the deposition rate. Additionally, increasing the nitrogen or helium carrier gas dilution flow will decrease the deposition rate.

The resultant deposited film contains titanium nitride carbide material. The titanium nitride carbide film is treated with a low frequency 350 kHz induced $N_2/H_2$ plasma generated by a high plasma power of about 750 watts. Such treatment reduces carbon concentration of the originally deposited titanium nitride layer. The plasma treatment duration depends on the thickness of the deposited titanium nitride layer. The titanium nitride layer may have a thickness within a range from about 5 Å to about 20 Å, for example, about 15 Å. Therefore, the plasma process may occur for a time period within a range from about 10 seconds to about 20 seconds, for example, about 15 seconds.

While the foregoing is directed to embodiments of the invention, other and further embodiments of the invention may be devised without departing from the basic scope thereof, and the scope thereof is determined by the claims that follow.

The invention claimed is:

1. A method for forming a titanium nitride barrier stack on a substrate, comprising:
   depositing a first titanium nitride layer on the substrate by a metal-organic chemical vapor deposition process;
   densifying the first titanium nitride layer by exposing the substrate to a plasma process;
   depositing a second titanium nitride layer on the first titanium nitride layer by the metal-organic chemical vapor deposition process;
   densifying the second titanium nitride layer by exposing the substrate to the plasma process;
   depositing a conductive material on the substrate; and
   exposing the substrate to an annealing process, wherein the titanium nitride barrier stack has a copper diffusion potential of less than about $5\times10^{10}$ atoms/cm$^2$.

2. The method of claim 1, wherein the copper diffusion potential is less than about $1\times10^{10}$ atoms/cm$^2$.

3. The method of claim 1, further comprising:
   depositing a third titanium nitride layer on the second titanium nitride layer by the metal-organic chemical vapor deposition process; and
   densifying the third titanium nitride layer by exposing the substrate to the plasma process.

4. The method of claim 3, wherein the first titanium nitride layer has a thickness of about 15 Å or less, the second titanium nitride layer has a thickness of about 15 Å or less, and the third titanium nitride layer has a thickness of about 15 Å or less.

5. The method of claim 1, wherein the substrate is exposed to a plasma gas during the plasma process, the plasma gas comprises hydrogen and a gas selected from the group consisting of nitrogen, argon, helium, neon, and combinations thereof.

6. The method of claim 5, wherein each of the titanium nitride layers is exposed to the plasma for a time period within a range from about 10 seconds to about 20 seconds and at a plasma power within a range from about 750 watts to about 1,250 watts.

7. The method of claim 1, wherein the annealing process occurs for a time period within a range from about 30 minutes to about 90 minutes and at a temperature within a range from about 350° C. to about 500° C.

8. The method of claim 1, wherein the titanium nitride barrier stack is deposited on a metallic titanium layer disposed on the substrate, and the metallic titanium layer is deposited on the substrate by a physical vapor deposition process.

9. The method of claim 8, wherein the conductive material comprises an element selected from the group consisting of copper, tungsten, aluminum, titanium, tantalum, ruthenium, cobalt, alloys thereof, and combinations thereof.

* * * * *